United States Patent [19]
Chakradhar et al.

[11] Patent Number: 5,983,381
[45] Date of Patent: Nov. 9, 1999

[54] PARTITIONING AND REORDERING METHODS FOR STATIC TEST SEQUENCE COMPACTION OF SEQUENTIAL CIRCUITS

[75] Inventors: Srimat Chakradhar, North Brunswick; Michael S. Hsiao, Highland Park, both of N.J.

[73] Assignee: NEC USA Inc., Princeton, N.H.

[21] Appl. No.: 09/001,542

[22] Filed: Dec. 31, 1997

[51] Int. Cl.[6] .................................................. G01R 31/28
[52] U.S. Cl. ........................... 714/738; 714/720; 714/728
[58] Field of Search ..................................... 714/738, 739, 714/741, 742, 728, 720, 724; 324/73.1

[56] References Cited

U.S. PATENT DOCUMENTS 5,444,717  8/1995  Rotker et al. .......................... 371/27.1
5,617,431  4/1997  Tupurt et al. .......................... 371/27.1

OTHER PUBLICATIONS

Pomeranz et al, "Static Compaction for Two–Pattern Test Sets", The Fourth Asian Test Symposium, IEEE, 1995.

Higami et al, "Static Test Compaction for IDDQ testing of Sequential Circuits", pp. 9–13, IEEE, Mar. 1998.

Guo et al, "on speeding–up Vector Restoration Based Static Compaction of Test Sequences for Sequential Circuits", pp. 467–471, IEEE, Sep. 1998.

Primary Examiner—Hoa T. Nguyen
Attorney, Agent, or Firm—Sughrue, Mion, Zinn, Macpeak & seas, PLLC

[57] ABSTRACT

Methods of compacting sequential circuit test vector set by partitioning of faults into hard and easy faults, re-ordering vectors in a test set by moving sequences that detect hard faults to the beginning of the test set, and a combination of partitioning and re-ordering.

17 Claims, 8 Drawing Sheets

FIG. 6

```
VECTOR REORDER WITH PARTITIONING()

/*SELECT PARTITIONING POSITION*/
    FAULT SIMULATE AND PICK THE POSITION WHERE
        Y% OF DETECTED FAULTS ARE DETECTED

/*VECTOR-REORDER LOOP (COARSE GRAIN) */
    WHILE NOT EVERY VECTOR IN THE TEST SET HAS
        BEEN RE-ORDERED
        RE-ORDER LAST COARSE GRAIN% OF TEST SET
            TO THE BEGINNING
        FAULT SIMULATE WITH RESPECT TO ONLY
            (100-Y)% OF THE DETECTED FAULTS
              AND REMOVE ANY VECTORS AT THE END
              OF THE RE-ORDERED TEST SET

/*VECTOR RE-ORDER LOOP (FINE GRAIN) */
    WHILE NOT EVERY VECTOR IN THE TEST SET HAS
        BEEN RE-ORDERED
        RE-ORDER LAST FINE-GRAIN% OF TEST SET
            TO THE BEGINNING
        FAULT SIMULATE WITH RESPECT TO ONLY
            (100-Y)% OF THE DETECTED FAULTS
              AND REMOVE ANY VECTORS AT THE END
              OF THE RE-ORDERED TEST SET
    /*CONCATENATION WITH FIRST PARTITION */
    APPEND THE FIRST PORTION THAT DETECTED Y% OF
        DETECTED FAULTS TO THE RE-ORDERED TEST
        SET
    FAULT SIMULATE TO REMOVE ANY VECTORS AT THE
        END OF THE TEST SET
```

FIG. 7

| CKT | TOTAL FAULTS | ORIGINAL | | NO-PARTITION | | | | PARTITION | | | |
|---|---|---|---|---|---|---|---|---|---|---|---|
| | | VEC | DET | VEC | %R | DET | TIME (s) | VEC | %R | DET | TIME (s) |
| s298 | 308 | 322 | 265 | 184 | 42.8 | 265 | 105.0 | 184 | 42.8 | 265 | 74.5 |
| s344 | 342 | 127 | 328 | 51 | 59.8 | 328 | 41.4 | 84 | 33.9 | 328 | 28.6 |
| s382 | 399 | 2074 | 312 | 704 | 66.6 | 325 | 240.0 | 764 | 63.2 | 312 | 91.5 |
| s400 | 426 | 2214 | 352 | 878 | 60.3 | 352 | 324.0 | 967 | 56.3 | 352 | 117.0 |
| s444 | 474 | 2240 | 289 | 826 | 63.1 | 389 | 360.0 | 516 | 77.0 | 389 | 118.0 |
| s526 | 555 | 2258 | 361 | 1328 | 41.2 | 361 | 528.0 | 1328 | 41.2 | 361 | 202.0 |
| s641 | 467 | 209 | 404 | 114 | 45.5 | 404 | 92.8 | 120 | 42.6 | 404 | 65.0 |
| s713 | 581 | 173 | 476 | 110 | 36.4 | 476 | 92.3 | 129 | 25.4 | 476 | 79.6 |
| s820 | 850 | 1115 | 813 | 882 | 20.9 | 813 | 383.0 | 810 | 27.4 | 813 | 185.0 |
| s832 | 870 | 1137 | 817 | 768 | 32.5 | 817 | 400.0 | 988 | 13.1 | 817 | 202.0 |
| s1196 | 1242 | 435 | 1239 | 336 | 22.8 | 1239 | 276.0 | 370 | 14.9 | 1239 | 110.0 |
| s1238 | 1355 | 475 | 1283 | 338 | 28.8 | 1283 | 295.0 | 415 | 12.6 | 1283 | 129.0 |
| s1423 | 1515 | 150 | 750 | 134 | 10.7 | 750 | 270.0 | 150 | 0 | 750 | 72.1 |
| s1488 | 1486 | 1170 | 1444 | 622 | 46.8 | 1444 | 600.0 | 798 | 31.8 | 1444 | 304.0 |
| s1494 | 1506 | 1245 | 1453 | 622 | 50.0 | 1453 | 547.0 | 862 | 30.8 | 1453 | 286.0 |
| s5378 | 4603 | 912 | 3238 | 712 | 21.9 | 3238 | 1723.0 | 662 | 27.4 | 3238 | 825.0 |
| s35932 | 39094 | 496 | 34901 | 138 | 72.2 | 34901 | 45455.0 | 138 | 72.2 | 35002 | 15330.0 |
| am2910 | 2391 | 2023 | 2189 | 1569 | 22.4 | 2189 | 3819.0 | 1588 | 21.5 | 2189 | 884.0 |
| div16 | 2147 | 238 | 1679 | 154 | 35.3 | 1679 | 247 | 162 | 31.9 | 1679 | 142.0 |
| AVG | | | | | 41.1 | | 3927.0 | | 35.1 | | 1013.0 |

DET: NUMBER OF FAULTS DETECTED
VEC: TEST SET LENGTH
TIME: EXECUTION TIME
%R: PERCENT REDUCTION FROM ORIGINAL TEST SET SIZE
SMALLEST TEST SET SIZES/GREATEST COMPACTIONS HIGHLIGHTED IN BOLD

FIG. 8

| CKT | TOTAL FAULTS | ORIGINAL | | NO-PARTITION | | | | PARTITION | | | |
|---|---|---|---|---|---|---|---|---|---|---|---|
| | | VEC | DET | VEC | %R | DET | TIME (s) | VEC | %R | DET | TIME (s) |
| s298 | 308 | 194 | 265 | 132 | 32.0 | 265 | 74.3 | 132 | 32.0 | 265 | 63.3 |
| s344 | 342 | 86 | 329 | 48 | 44.2 | 329 | 39.3 | 58 | 32.6 | 329 | 24.4 |
| s382 | 399 | 1486 | 364 | 601 | 59.6 | 364 | 241.0 | 601 | 59.6 | 364 | 92.8 |
| s400 | 426 | 2424 | 383 | 1033 | 57.4 | 383 | 330.0 | 1033 | 57.4 | 383 | 133.0 |
| s444 | 474 | 1945 | 424 | 716 | 63.2 | 424 | 307.0 | 716 | 63.2 | 424 | 133.0 |
| s526 | 555 | 2642 | 454 | 1631 | 38.3 | 454 | 470.0 | 1631 | 38.3 | 454 | 281.0 |
| s641 | 467 | 166 | 404 | 136 | 18.1 | 404 | 122.0 | 139 | 16.3 | 404 | 77.4 |
| s713 | 581 | 176 | 476 | 122 | 30.7 | 476 | 109.0 | 121 | 31.3 | 476 | 77.5 |
| s820 | 850 | 590 | 814 | 525 | 11.0 | 814 | 370.0 | 559 | 5.3 | 814 | 405.0 |
| s832 | 870 | 701 | 818 | 564 | 19.5 | 818 | 357.0 | 607 | 13.4 | 814 | 160.0 |
| s1196 | 1242 | 574 | 1239 | 277 | 51.7 | 1239 | 243.0 | 329 | 42.7 | 1239 | 121.0 |
| s1238 | 1355 | 625 | 1282 | 324 | 48.2 | 1282 | 273.0 | 339 | 45.8 | 1282 | 136.0 |
| s1423 | 1515 | 3943 | 1414 | 1273 | 67.7 | 1414 | 1950.0 | 1239 | 68.6 | 1414 | 541.0 |
| s1488 | 1486 | 593 | 1444 | 481 | 18.9 | 1444 | 688.0 | 523 | 11.8 | 1444 | 254.0 |
| s1494 | 1506 | 540 | 1453 | 472 | 12.6 | 1453 | 736.0 | 494 | 8.5 | 1453 | 258.0 |
| s5378 | 4603 | 11481 | 3639 | 1347 | 88.3 | 3639 | 3185.0 | 1340 | 88.4 | 3639 | 2337.0 |
| s35932 | 39094 | 257 | 35100 | 133 | 48.2 | 35100 | 35486.0 | 139 | 45.9 | 35100 | 9359.0 |
| am2910 | 2391 | 2509 | 2189 | 556 | 77.8 | 2189 | 1091.0 | 635 | 74.7 | 2189 | 396.0 |
| mult16 | 1708 | 2696 | 1665 | 201 | 88.1 | 1665 | 371.0 | 184 | 89.2 | 1665 | 167.0 |
| div16 | 2147 | 1098 | 1815 | 504 | 54.1 | 1815 | 1073.0 | 483 | 56.0 | 1815 | 372.0 |
| AVG | | | | | 48.9 | | 2501.0 | | 46.4 | | 796.0 |

DET : NUMBER OF FAULTS DETECTED
VEC : TEST SET LENGTH
TIME : EXECUTION TIME
%R : PERCENT REDUCTION FROM ORIGINAL TEST SET SIZE
SMALLEST TEST SET SIZES/GREATEST COMPACTIONS HIGHLIGHTED IN BOLD

FIG. 9

| CKT | GATES | FFs | TOTAL FAULTS | ORIGINAL VEC DET | PARTITION VEC DET | %R |
|---|---|---|---|---|---|---|
| CIRCUIT 1 | 7428 | 137 | 8411 | 2228<br>6780 | 1532<br>6781 | 31.2<br>35.5 |
| CIRCUIT 2 | 6387 | 130 | 6976 | 3190<br>5992 | 2059<br>5997 | 10.2 |
| CIRCUIT 3 | 11784<br>24784 | 487<br>995 | 18701<br>36280 | 3963<br>17182<br>3807<br>34456 | 3559<br>17287<br>2411<br>34457 | 36.7 |

GATES : NUMBER OF GATES
FFs : NUMBER OF FLIP-FLOPS
DET : NUMBER OF FAULTS DETECTED
VEC : TEST SET LENGTH
%R : PERCENT REDUCTION FROM ORIGINAL TEST SET CLAIM

PARTITIONING AND REORDERING METHODS FOR STATIC TEST SEQUENCE COMPACTION OF SEQUENTIAL CIRCUITS

BACKGROUND OF THE INVENTION

1. Field of the Invention

This invention relates to methods for compacting test sets for sequential circuits. More specifically, to partitioning and reordering methods for fast static test sequence compaction of sequential circuits.

This application relates to U.S. application Ser. No. 09/001,543 filed on Dec. 31, 1997 entitled, "State Relaxation Based Subsequence Removal Method for Fast Static Compaction in Sequential Circuits," which is assigned to the Assignee of the present invention and which is incorporated herein by reference.

2. Background and Description of Related Art

Since the cost of testing sequential circuits is directly proportional to the number of test vectors in a test set, short test sequences are desirable. Reduction in test set size can be achieved using static or dynamic test set compaction algorithms. Dynamic techniques such as those described in Chakradhar, S., et al., "Bottleneck Removal Algorithm for Dynamic Compaction and Test Cycle Removal," Proc. European Design Automation Conf., pp. 98–104, September 1995), Chakradhar, S., et al., "Bottleneck Removal Algorithm for Dynamic Compaction in Sequential Circuits," IEEE Trans. on Computer-Aided Design, (Accepted for Publication) 1997 and Niermann, T. M., et al., "Method for Automatically Generating Test Vectors for Digital Integrated Circuits," U.S. Pat. No. 5,377,197, 1994, perform compaction concurrently with the test generation process. These techniques often require modification of the test generator.

Static compaction techniques, on the other hand, are employed after the test generation process. Obviously, static techniques are independent of the test generation algorithm and do not require modifications to the test generator. In addition, static compaction techniques can further reduce the size of test sets obtained after dynamic compaction.

Several static compaction approaches for sequential circuits have been proposed in the following papers: Niermann, T. M., et al. "Test Compaction for Sequential Circuits," IEEE Trans. Computer-Aided Design, vol. 11, no. 2, pp. 260–67, February 1992, So, B., "Time-efficient Automatic Test Pattern Generation System," Ph.D. Thesis, EE Dept. Univ. of Wisconsin-Madison, 1994, Pomeranz, I., et al., "On Static Compaction of Test Sequences for Synchronous Sequential Circuits," Proc. Design Automation Conf., pp. 215–20, June 1996 and Hsiao, M. S. et al., "Fast Algorithms for Static Compaction of Sequential Circuit Test Vectors," Proc. IEEE VLSI Test Symp., pp. 188–195, April 1995.

Some of these approaches (Niermann, Time Compaction, So) cannot reduce test sets produced by random or simulation-based test generators. Static compaction techniques based on vector insertion, omission, or selection have also been investigated (Pomeranz). These techniques require multiple fault simulation passes. If a vector is omitted or swapped, the fault simulator is invoked to make sure that the fault coverage is not affected. Vector restoration techniques, as described in Guo, R., et al., "Procedures for Static Compaction of Test Sequences for Synchronous Sequential Circuits Based on Vector Restoration," Technical Report Aug. 3, 1997, Electrical and Computer Engineering Department, University of Iowa, August 1997, aim to restore sufficient vectors necessary to detect all faults, starting with the harder faults. Fast static test set compaction based on removing recurrence subsequences that start and end on the same states has also been reported recently (Hsiao). However, these test sets are not as compact as those achieved by algorithms that use multiple fault simulation passes.

SUMMARY OF THE INVENTION

The present invention included methods of compacting a sequential circuit test vector set by partitioning faults into hard and easy faults, re-ordering vectors in a test set and a combination of partitioning and re-ordering.

FIG. 1 shows two typical fault coverage curves. The curve with a small dip, curve 2, is associated with test sets that are composed of random vectors followed by deterministic vectors that are generated by automatic test pattern generators (ATPG's). In either case, fault coverage increases rapidly for the first few test vectors and then eventually levels off. In this level region, a large number of vectors are required to detect very few additional faults. This observation is formalized by using two parameters x ($x_1$ for curve 1, $x_2$ for curve 2) and y. The first x % of the vectors detect y % of the faults. For example, it is possible that the first 10% of the vectors in the test set detect 90% of the faults. It should also be observed that faults detected during the quick rise of the fault coverage curve are also usually detected by vectors generated during the level region of the curve. Empirical observations lead to two questions:

1. Because the majority of the test set ((100-x) % of the vectors) is used to detect a few hard faults ((100-y) % of the detected faults), can the computational time be reduced by compacting the test set only with respect to the hard faults?
2. If the test set is re-ordered by placing vectors comprising the last w % of the test set to be at the beginning of the test set, how much of the y % easily detectable faults will still be detected by the re-ordered w % vectors?

The first question suggests that fault list partitioning be performed for static compaction. The test set is compacted by only considering the hard faults. This substantially reduces the cost of fault simulation because only a few faults have to considered during multiple fault simulation passes. Also, computationally expensive static compaction techniques that have been proposed in the past can now be re-examined. This is because the cost of fault simulation can be greatly reduced by using fault list partitioning.

With respect to the second question, re-ordering of test vectors for sequential circuits must be done carefully. This is because detection of a fault in a sequential circuit requires a specific sequence of vectors. Re-ordering is effective if vectors that detect hard faults also detect other faults.

The basic method of this invention is to partition the test vector set into two subsequences and then perform re-ordering compaction on one of the two subsequences.

The contribution of this invention is two fold. First, the computational cost for static test set compaction is substantially reduced by careful fault list and test set partitioning. Second, re-ordering of vectors is shown to be very effective in reducing the test set size. Significant compactions have been obtained very quickly for large ISCAS89 sequential benchmark circuits and several synthesized circuits.

BRIEF DESCRIPTION OF THE DRAWINGS

FIG. 6 shows a test set algorithm via partitioning and re-ordering.

FIG. 7 is a table showing compaction results for HITEC test sets.

FIG. 8 is a table showing compaction results for STRATEGATE test sets.

FIG. 9 is a table showing compaction results for production circuits.

DETAILED DESCRIPTION OF THE EMBODIMENTS

The embodiments will be described below with reference to the figures and the following examples. The preferred embodiment, which is a combination of partitioning and re-ordering, will be described after the individual methods are described. Given a test set T, a subsequence of the test set is represented as $T[v_i, v_{i+1}, \ldots, v_j]$, where $v_i$ and $v_j$ are the $i^{th}$ and $j^{th}$ vectors in the test set T, respectively. Furthermore, the set of faults detected by a subsequence $T[v_i, \ldots, v_j]$ is denoted as $F_{det}[v_i, \ldots, v_j]$.

Consider a test set T with n vectors $v_1, \ldots, v_n$. Assume that this test set detects f faults. If a static compaction algorithm requires m fault simulations, then the worst case time required for multiple fault simulation passes is proportional to m×n×f single-vector logic simulations.

Test Set and Fault List Partitioning

Figure 2:
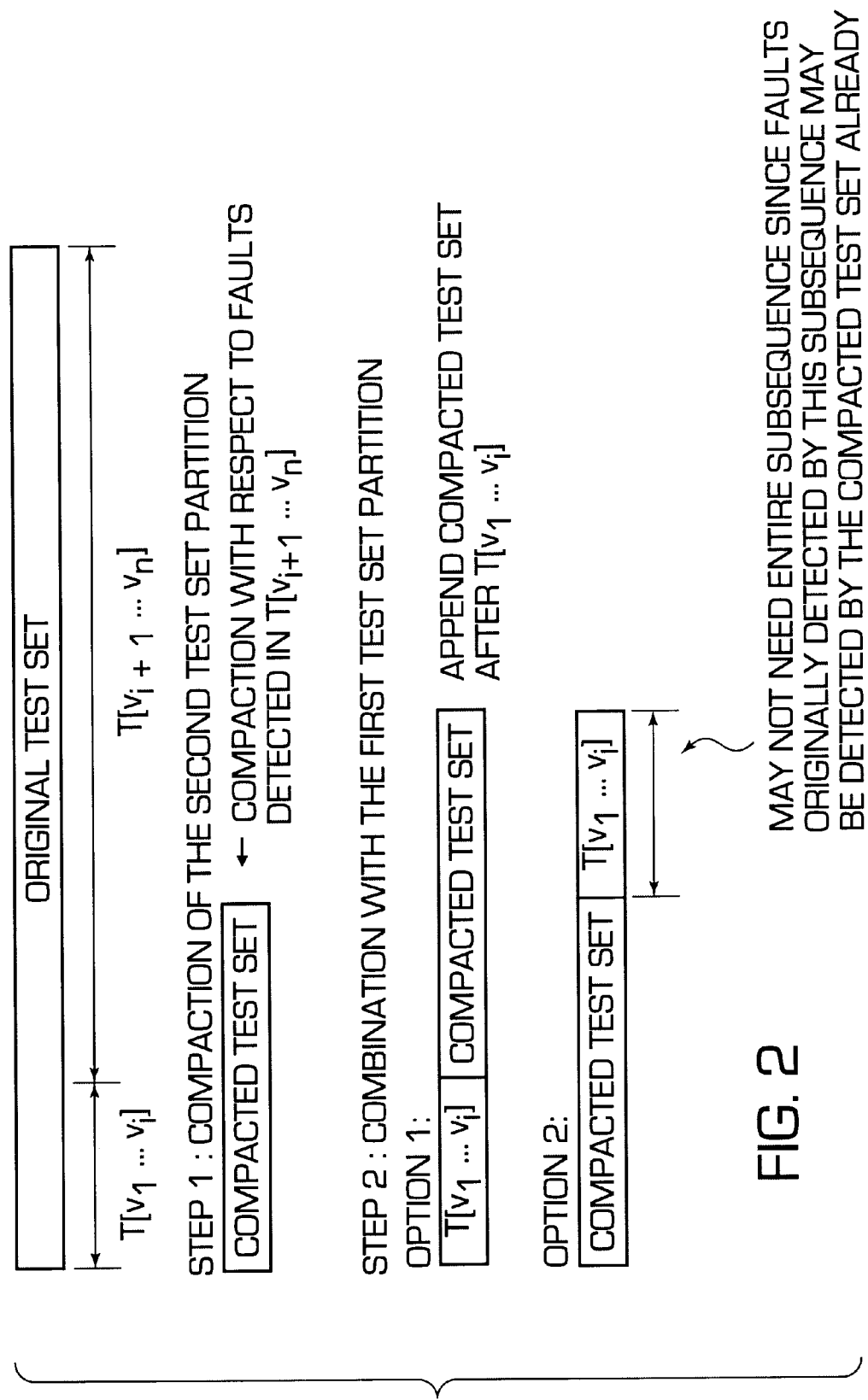
FIG. 2 is a diagram showing test set compaction using partitioning.

The process of compaction using partitioning is illustrated in FIG. 2.

It begins by splitting the original test set T into two subsequences $T[v_i, \ldots, v_i]$ and $T[v_{i+1}, \ldots, v_n]$. Let r be the ratio of total faults f and the set of faults detected by the subsequence $T[v_{i+1}, \ldots, v_n]$:

$$r = \frac{f}{F_{det}[v_{i+1}, \ldots, v_n]}$$

If the test set is compacted with respect to only faults in $F_{det}[v_{i+1}, \ldots, v_n]$ (Step 1 of FIG. 2), then the computational cost can be reduced to m×n×(f/r). If r is large, then significant savings in computational time can be achieved. For example, if only 10% of the total faults are detected by the second subsequence, then the time required for multiple fault simulation passes can be reduced by an order of magnitude.

After compaction in Step 1, it is possible that the compacted test set $T_{compact}$ may not detect all target faults. This is because only a subset of faults were considered during compaction. A possible solution is to combine $T_{compact}$ and the first subsequence $T[v_1, \ldots, v_i]$ (Step 2 of FIG. 2). One can always append $T_{compact}$ to the first sequence $T[v_1, \ldots, v_i]$. This ensures that all target faults f are detected. A second option is to append $T[v_1, \ldots, v_i]$ at the end of the sequence $T_{compact}$. This is a better combination because many of the faults detected in $T[v_1, \ldots, v_i]$ may have already been detected by $T_{compact}$. This can result in dropping of some or all of the vectors in subsequence $T[v_1, \ldots, v_i]$.

Note that after fault list partitioning, static compaction of the test set T can be performed by any compaction algorithm. In fact, more expensive compaction algorithms may now be cost effective due to the lower cost of fault simulation.

Figure 3A:
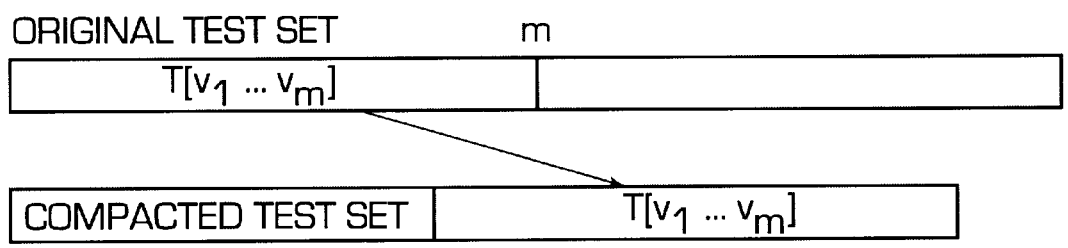
FIGS. 3(a) and (b) are diagrams showing selection of the partition at the middle and beginning of the test set.
Figure 3B:
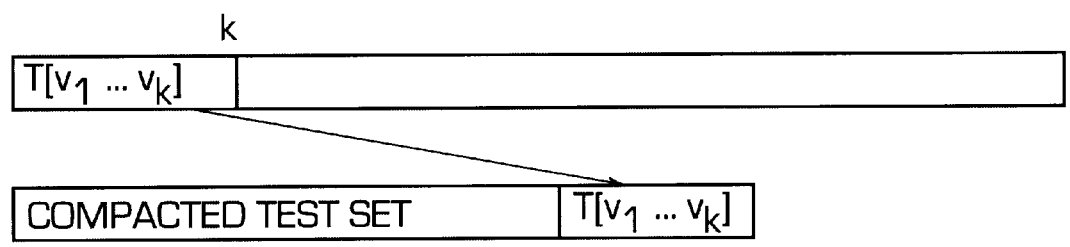

It is better to split the test set at a position closer to the beginning of the test set. Suppose the test set is split in half. Then, compaction of test set T has to be performed by considering only faults detected by the second half of the test set. However, after the first phase of compaction, the first half of the test set still has to be appended, as shown in FIG. 3(a), resulting in a possibly less compact test set. On the other hand, if the test set had been partitioned at an earlier position, as shown in FIG. 3(b), then the portion of the original test set that has to be appended is much smaller. However, the cost of fault simulation during compaction can be higher because more faults may have to be simulated.

Static compaction is performed with respect to only a fraction of the faults. Therefore, the computational cost of compaction procedures would be less than a method that considers all faults. Also, one would expect less compact test sets because only a subset of faults are considered for compaction. However, experiments show that both computational cost and the quality of compaction are benefited by fault list partitioning.

Re-Ordering of Vectors

Figure 1:
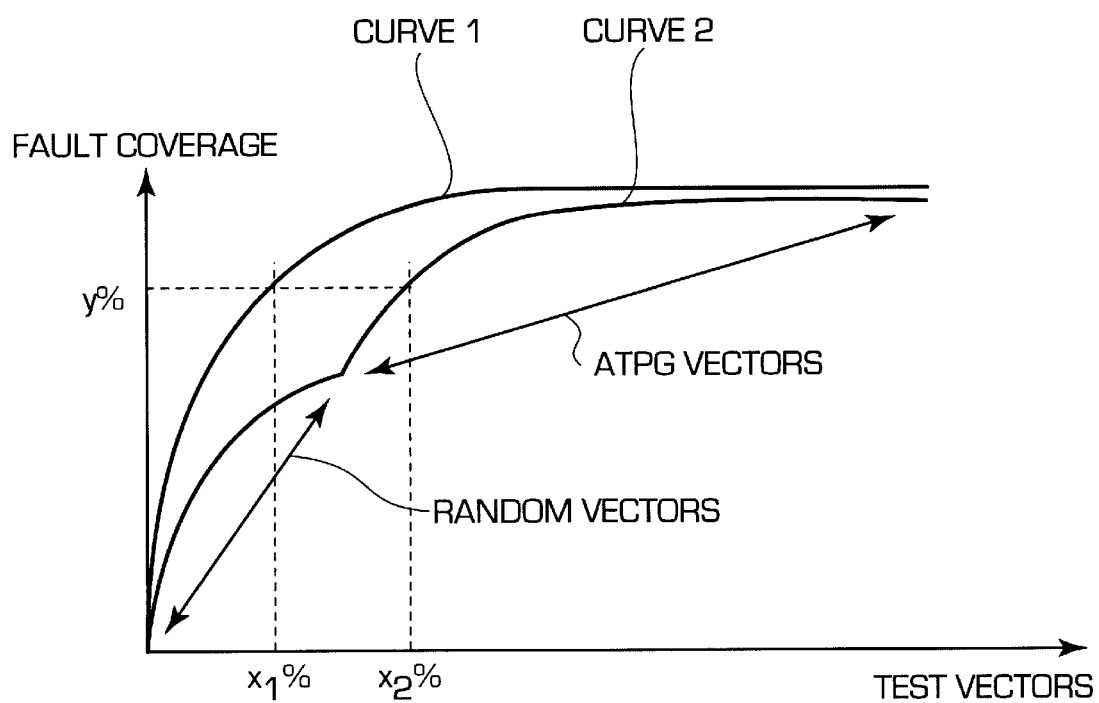
FIG. 1 is a graph of typical fault coverage curves.

Another valid question that stems from the shape of the fault coverage curve illustrated in FIG. 1 is whether sequences that detect hard faults can also detect many other, easier faults. In other words, if the sequence of vectors that detect hard faults is copied to the beginning of the test set, can some vectors in the modified test set be omitted? Obviously, it is desirable to compact the modified test set so that it is smaller than the original test set.

Figure 4:
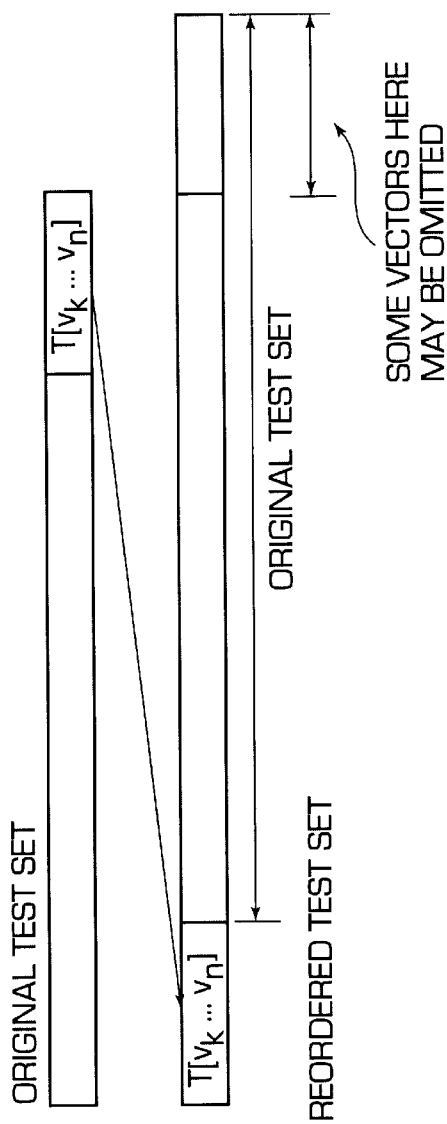
FIG. 4 is a diagram showing a re-ordered test set.

Again, consider a test set $T[v_1, \ldots, v_n]$ that detects f faults. If a new test sequence is created by copying the subsequence $T[v_k, \ldots, v_n]$, $1 \leq k \leq n$, to be at the beginning of the original test set T (see FIG. 4), then the modified test sequence is $Tnew[v_k, \ldots, v_n, v_1, \ldots, v_n]$. All target faults are still detectable because the original test set is a subset of the modified test sequence.

There are (n−k+1)+n vectors in the modified test set. Clearly, at least n−k+1 vectors can be omitted from the modified test set without affecting the fault coverage. This is because the first n−k+1 vectors of the modified test set can always be dropped and the compact test set is same as the original test set T.

Figure 5:
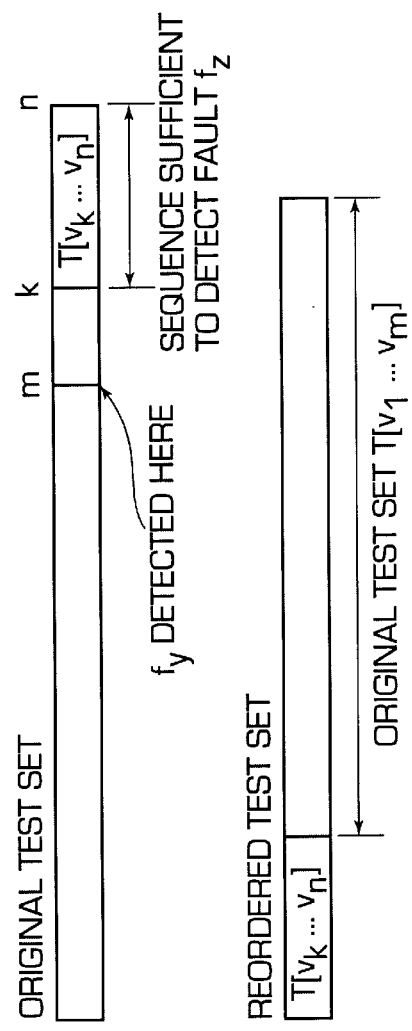
FIG. 5 is a diagram showing a shorter re-ordered test set.

However, it is possible that more than n−k+1 vectors can be dropped by omitting vectors at the end of the modified test set. For example, consider two faults $f_y$ and $f_z$ that are detected by the original test set $T[v_1, \ldots, v_n]$. Also, assume that faults $f_y$ and $f_z$ are detected after vectors $v_m$ and $v_n$, respectively. Here, $v_n$ is the last vector in the test set and m<n. Suppose there exists a k, m<k<n, such that subsequence $T[v_k, \ldots, v_n]$ detects only one fault $f_z$. FIG. 5 illustrates this scenario. Re-ordering $T[v_k, \ldots, v_n]$ vectors yields the modified test set $T[f_k, \ldots, v_n, v_i, \ldots, v_n]$. Clearly, the subsequence $T[v_m+1, \ldots, v_n]$ at the end of the modified test set is unnecessary, since this subsequence contributes to the detection of only fault $f_z$ and this fault is already detected by the first few vectors of the modified test set. Therefore the modified test set can be compacted to be $T[v_k, \ldots, v_n, v_1, \ldots, v_m]$. The size of the compact test set is (n−k+1)+m. Since k>m, the new test set size can be less than the original test size n. For example, if k=m+3, then the compacted test set is two vectors smaller than the original test set.

Computing the exact k for the last detected fault $f_z$ may be computationally expensive. Instead, an arbitrary k can be selected and the subsequence $T[v_k, \ldots, v_n]$ can be re-ordered to be at the beginning of the test set. Fault simulation of the modified test sequence will determine whether some vectors can be removed. This process can be repeated until every vector in the original test set has been re-ordered.

The size of the subsequence being re-ordered plays a significant role in determining the amount of compaction that is possible. For example, if large subsequences are re-ordered, then less compaction is achieved. When the subsequence size is small, then more compaction is achievable but at a higher computational cost for fault simulation. For instance, if the re-ordered subsequence consists of 5% of vectors in the test set, then it would take up to 20 passes to finish re-ordering of all vectors in the original test set. Also, this will require a maximum of 20 fault simulation passes. On the other hand, if the re-ordered subsequence consists of only 1% of the vectors then it would take up to 100 passes. Note that if a large number of vectors are omitted during the first few passes then the total number of passes required can be significantly less than the maximum.

Combined Test Set Compaction Method

The first step in the combined test set compaction method is to perform test set and fault-list partitioning. This involves splitting of the test set into two subsequences $T[v_1, \ldots, v_i]$ and $T[v_{i+1}, \ldots v_n]$. Only faults detected by the second subsequence are considered for compaction. The specific value of i ($1 \leq i < n$) has a significant impact on the execution time and quality of the resulting compacted test set. This value can be determined in several ways:

1. Choose a value for i such that the subsequence $T[v_{i+1}, \ldots v_n]$ has a pre-determined number of vectors, or
2. Choose a value of i such that the subsequence $T[v_1, \ldots v_i]$ detects a pre-determined number of faults, or
3. Choose a value for i based on both faults and pre-determined number of vectors.

For example, one can partition a test set by 1) including 90% of the test set as part of the second subsequence, or 2) by including sufficient vectors in the first subsequence so that 80% of the faults are detected and the remaining vectors are included in the second subsequence. In either case, faults detected by the first subsequence are not considered during compaction of the original test set.

There are advantages and disadvantages of each partitioning technique. If the test set is split based on a pre-determined number of vectors, then few faults may be detected by the first subsequence. This may require consideration of a large number of faults during compaction, and the savings in execution times may not be as great. On the other hand, if partitioning is performed by including sufficient number of vectors in the first subsequence so that a pre-determined percentage of faults are detected, then the first subsequence can have too many vectors. This can result in a less compact test set. One technique may be better than the other depending on the test set and the target fault list. Finding the optimal value of i may be as difficult as the compaction problem itself. In the present invention, the value of i is chosen based on a pre-determined percentage of faults that have to be detected by the first subsequence. The value of i can also be chosen using more elaborate methods.

After partitioning has been performed, re-ordering is performed. Re-ordering a subsequence of vectors in a test set results in a new test that is a concatenation of the subsequence and the original test set. The size of the subsequence to be re-ordered has a significant impact on the execution time and quality of the resulting compacted test set. For example, if a large number of vectors are re-ordered during each iteration, then the execution time will be small but resultant test sets may be less compact.

Selection of the number of vectors to reorder is also dependent on the test set and the target fault list. In general, coarse-grain (more vectors) re-ordering may be better for large test set sizes. This is because fine-grain re-ordering can require a large number of fault simulation passes, and the computing resources required can be prohibitive. However, fine-grain re-ordering can lead to good compaction. Therefore, a hybrid approach is developed. The test set is first quickly reduced using coarse-grain re-ordering. Then, fine-grain reordering is performed to further reduce the test set. Coarse-grain re-ordering is performed by considering a subsequence size of 5% of the test set. Then, fine-grain reordering is performed by considering the subsequence size to be 1% of the test set. This two-step reordering has proven to be effective for many circuits.

The pseudo-code for vector-reordering with partitioning is shown in FIG. 6. The method involves first picking a partitioning point. Next, coarse and fine-grain re-ordering is performed with respect to only (100-Y) % of the partitioned faults. When the re-ordering is complete, the first partition of the vectors is appended. Fault simulation is again applied to remove any non-contributing vectors from the first partition. If no partitioning is desired, the partitioning and the concatenation steps in the algorithm are skipped, and Y is set equal to 0%.

The static test set compaction algorithm was implemented in C by repetitively calling a commercial fault simulator via system calls. HITEC and STRATEGATE test sets generated for both ISCAS89 sequential benchmark circuits and several synthesized circuits were used to evaluate the effectiveness of the algorithms. HITEC is a state-of-the-art deterministic test generator. STRATEGATE is a simulation-based test generator based on genetic algorithms that generate test sets with very high fault coverages. All experiments were performed on a Sun UltraSPARC with 256 MB RAM. Note that due to repetitive system calls to the commercial fault simulator, there is extra overhead in reading in the circuit, fault list, and setting up of the data structures necessary for compaction.

Experimental Results

The compaction results are shown in the tables in FIGS. 7 and 8 for HITEC and STRATEGATE vectors, respectively. Both tables show the total numbers of faults, the number of vectors in the original test set, and the number of faults detected by the test set. For each test set, compact test sets are generated using two methods. One method compacts the test set by only considering re-ordering of vectors. Results for this experiment are shown in column No-partition. The number of vectors in the compact test set are shown in column Vec, the percentage reduction in test vectors as compared to the original test set is shown in column % R, the number of faults detected by the compact test set is shown in column Det and the CPU seconds required is shown in column Time. The second method uses both partitioning and re-ordering. Results for this experiment are shown in column Partition.

The partitioning technique splits the test set by considering sufficient vectors in the first subsequence so that 80% of faults are detected. Therefore, the second subsequence consists of only 20% of the faults, and compaction of the entire test set is done with respect to only these faults. After the first phase of compaction, the first subsequence is appended to the compact test set. Vector-reordering is based on a two-step process. First, subsequences that include 5% of the test set (coarse-grain re-ordering) are considered, followed by the second step that considers re-ordering of sequences that include 1% (fine-grain re-ordering) of the test set.

For most circuits, significant reductions in test set sizes were achieved for both vector re-ordering without partitioning and vector re-ordering with partitioning. Fault coverages for the compacted test sets are always greater than or equal to the original fault coverages. For example, in circuit s35932, the compacted HITEC test set detected more faults. Since STRATEGATE vectors already provide high fault coverages, additional faults were not detected after compaction.

On average, 41.1% and 35.1% reductions were obtained for HITEC vectors with and without partitioning, respectively, with a maximum test set reduction of 72.2% for circuit s35932. Similarly, averages of 48.9% and 46.4% reductions were achieved for STRATEGATE vectors with and without partitioning, with maximum test set reduction of 88.4% for s5378. The tables in FIGS. 7 and 8 show that execution times are significantly lower with partitioning. For smaller circuits, partitioning reduces the execution time by about 50%. For the larger circuits, the execution time is reduced by a factor of 4.32 (compaction of HITEC vectors for circuit am2910).

Ideally, by considering 20% faults during compaction, a 5-fold increase in speed can be expected. This is seen for larger circuits. Ideal measures are difficult to obtain due to fixed overheads from logic-simulation costs. For instance, if logic-simulation constitutes 40% of total simulation cost (this cost includes logic and fault simulation costs), then the best speed-up we can achieve is $$\frac{1}{(20\% \times 60\%) + 40\%} = 1.9$$

Thus, greater fractions of the simulation cost are needed for logic simulation for smaller circuits due to the fewer numbers of faults. On average, partitioning accelerated the compaction process by 2.90 times for HITEC vectors and by 3.14 times for STRATEGATE vectors.

The size of compact test sets derived using partitioning is comparable to the size of compact test sets derived without using partitioning. For example, differences between compacted STRATEGATE test set sizes for partitioning and non-partitioning techniques are less significant. However, there are cases where marginally smaller compact test sets are achieved in the no partitioning case. This seems to happen when the number of vectors necessary to detect 80% of faults is large. However, compaction with partitioning appears to result in marginally better compact test sets when the number of vectors in the first subsequence of the split test set is small.

Examination of HITEC and STRATEGATE test sets reveals that a smaller percentage of STRATEGATE vectors are necessary to detect 80% of detected faults. Therefore, a larger percentage of HITEC vectors are required to detect 80% of the faults. For HITEC test sets, compaction without partitioning resulted in marginally better test sets than those with partitioning. One can always partition at a lower fault coverage (e.g., at 60% or 70%) to reduce the number of vectors in the first subsequence, but this can increase the execution times for compaction with partitioning. There are always exceptions. For instance, in the HITEC test set for s444, compaction with partitioning achieves a significantly more compact test set in much shorter execution time. This is because the first 80% of the detected faults are also detected by vectors in the second subsequence that detects hard faults (20% of remaining faults).

The static compaction method was also applied to a few large production circuits. These circuits have several non-Boolean primitives, such as tristate buffers, bidirectional buffers and buses. In addition, they have set/reset flip-flops and multiple clocks. Original test sets for these circuits were derived using a commercial test generator. Compaction results are shown in the table in FIG. 9. For these circuits, it was not possible to run experiments without partitioning because the run times were prohibitively long. Therefore, compaction with partitioning had to be used to cut down the execution times. Significant reductions in test set sizes have been achieved as compared to the original test set. Furthermore, fault coverages obtained by the compacted test sets were often higher.

In terms of reductions in test set sizes among the various static test set compaction techniques, vector-omission based compaction as described in Pomeranz generally outperforms other compaction approaches. However, such technique may not be applicable to large circuits or large test sets. Compaction based on recurrence subsequence removal is very fast, but it produces less compact test sets. In addition, sometimes a slight drop in fault coverage may result after compaction due to the optimistic assumptions made in the subsequence removal algorithm. Circuits for which only a few recurrence subsequences exist, such as circuits s1196, s1238, s1423, s5378, and am2910, recurrence subsequence removal becomes ineffective. Finally, both Vector-restoration as described in Guo and the present invention produce compact test sets at less expensive costs than the Pomeranz method. These static compaction approaches are not constrained by lack of recurrence subsequences and significant reductions in test set sizes were achieved for these circuits.

One significant feature of the present invention is that the test-set and fault-list partitioning strategy can be applied to any of the previously proposed vector-omission (Pomeranz) and vector-restoration (Guo) methods to further reduce execution times. This is an important feature that distinguishes this method from the previously proposed methods. Overall, this method is practical for large designs.

The present invention embodies a new static test set compaction framework using fault list and test set partitioning, and vector-reordering. Significant reductions in test set sizes have been obtained using the invention. Furthermore, partitioning techniques rapidly accelerate the compaction process. Although not attempted here, partitioning and re-ordering techniques can be easily used to accelerate other known static compaction algorithms. These techniques can significantly reduce the CPU seconds required for compaction without compromising on the quality of compaction. Compaction algorithms based on extensive fault simulations can particularly benefit from the partitioning technique. Experiments show that the proposed compaction technique is viable for large circuits or large test sets.

While the above is a description of the invention in its preferred embodiments, various modifications and equivalents may be employed. Therefore, the above description and illustration should not be taken as limiting the scope of the invention which is defined by the claims.

What is claimed is:

1. A method for fast static compaction of a sequential circuit test vector set comprising the steps of:

(a) partitioning said test vector set into a first and second subsequence of test vectors;

(b) compacting said second subsequence of test vectors; and (c) appending said compacted second subsequence of test vectors to said first subsequence of test vectors.

2. The method of claim 1, wherein said compacted second subsequence of test vectors is appended to the end of said first subsequence of test vectors.

3. The method of claim 1, wherein said compacted second subsequence of test vectors is appended to the beginning of said first subsequence of test vectors.

4. The method of claim 3, further comprising the step of eliminating test vectors in said first subsequence of test vectors that detect faults detected by said compacted second subsequence of test vectors.

5. The method of claim 1, wherein said first subsequence of test vectors is less than said second subsequence of test vectors.

6. The method of claim 1, wherein the size of said first subsequence of test vectors is based on a predetermined number of test vectors.

7. The method of claim 1, wherein the size of said first subsequence of test vectors is based on a predetermined number of faults detected by said first subsequence of test vectors.

8. The method of claim 1, wherein the size of said first subsequence of test vectors is based on both a predetermined number of faults detected by said first subsequence of test vectors and a predetermined number of test vectors.

9. A method for fast static compaction of a sequential circuit test vector set comprising the steps of:
   (a) selecting a predetermined number of test vectors at the end of said test vector set;
   (b) copying and appending said selected test vectors to the beginning of said test vector set, creating a modified test vector set; and
   (c) compacting said modified test vector set by eliminating unnecessary test vectors.

10. The method of claim 9, wherein steps (a) through (c) are repeated until all of said test vectors remaining in said test vector set said have been selected, copied and appended.

11. A method for fast static compaction of a sequential circuit test vector set comprising the steps of:
   (a) partitioning said test vector set into a first and second subsequence of test vectors;
   (b) selecting a first predetermined number of test vectors at the end of said second subsequence of test vectors;
   (c) copying and appending said selected test vectors to the beginning of said second subsequence of test vector set, creating a modified test vector set; and
   (d) compacting said modified test vector set by eliminating unnecessary test vectors;
   (e) appending said compacted modified test vector set to said first subsequence of test vectors; and
   (f) compacting said combined first subsequence of test vectors and compacted modified test vector set.

12. The method of claim 11, wherein steps (b) through (d) are repeated until all of said test vectors remaining in said second subsequence of test vectors have been selected, copied and appended, prior to performing steps (e) and (f).

13. The method of claim 12, wherein the size of said first subsequence of test vectors is based on both a predetermined number of faults detected by said first subsequence of test vectors and a predetermined number of test vectors.

14. The method of claim 11, wherein steps (e) and (f) comprise the steps of:
   (e1) selecting a second predetermined number of test vectors at the end of said compacted modified test vector set, wherein said second predetermined number is less than said first predetermined number;
   (e2) copying and appending said second selected test vectors to the beginning of said compacted modified test vector set, creating a second modified test vector set;
   (e3) compacting said second modified test vector set by eliminating unnecessary test vectors;
   (e4) appending said compacted second modified test vector set to said first subsequence of test vectors; and
   (f) compacting said combined first subsequence of test vectors and compacted second modified test vector set.

15. The method of claim 14, wherein steps (b) through (d) are repeated until all of said test vectors remaining in said second subsequence of test vectors have been selected, copied and appended prior to performing step (e1) and then steps (e2) through (e4) are repeated until all of said test vectors remaining in said compacted modified test vector set have been selected, copied and appended, prior to performing step (f).

16. The method of claim 11, wherein the size of said first subsequence of test vectors is based on a predetermined number of test vectors.

17. The method of claim 11, wherein the size of said first subsequence of test vectors is based on a predetermined number of faults detected by said first subsequence of test vectors.

* * * * *